(12) United States Patent
Jansson

(10) Patent No.: US 6,639,529 B1
(45) Date of Patent: Oct. 28, 2003

(54) SYSTEM AND METHOD FOR DELAY CALIBRATION IN POSITION ENCODERS

(75) Inventor: Bjorn E. B. Jansson, Snohomish, WA (US)

(73) Assignee: Mitutoyo Corporation, Kanagawa-ken (JP)

( * ) Notice: Subject to any disclaimer, the term of this patent is extended or adjusted under 35 U.S.C. 154(b) by 0 days.

(21) Appl. No.: 10/146,437

(22) Filed: May 14, 2002

(51) Int. Cl.[7] ............................................... H03M 1/10
(52) U.S. Cl. ........................ 341/120; 341/115; 341/116; 341/110
(58) Field of Search ..................... 341/115, 116, 341/120, 110; 360/77, 77.01, 77.07, 77.12

(56) References Cited

U.S. PATENT DOCUMENTS

| | | | | |
|---|---|---|---|---|
| 4,511,884 A | * | 4/1985 | Serev et al. | 341/116 |
| 4,549,232 A | * | 10/1985 | Axmear et al. | 360/77.07 |
| 4,630,928 A | * | 12/1986 | Klingler et al. | 341/116 |
| 5,003,412 A | * | 3/1991 | Bizjak et al. | 360/77.01 |
| 5,070,421 A | * | 12/1991 | Sumiya et al. | 360/77.07 |
| 5,321,570 A | * | 6/1994 | Behr et al. | 360/121 |
| 5,463,393 A | * | 10/1995 | Havlicsek | 341/115 |
| 5,689,384 A | * | 11/1997 | Albrecht et al. | 360/77.12 |
| 5,721,546 A | * | 2/1998 | Tsutsumishita | 341/116 |
| 5,923,272 A | * | 7/1999 | Albrecht et al. | 341/55 |
| 6,188,341 B1 | * | 2/2001 | Taniguchi et al. | 341/116 |

* cited by examiner

Primary Examiner—Michael Tokar
Assistant Examiner—Lam T. Mai
(74) Attorney, Agent, or Firm—Christensen O'Connor Johnson Kindness PLLC

(57) ABSTRACT

Systems and methods are provided for calibrating a sample delay time between a position request time from a host computer and a position encoder sample time. The position encoder includes a readhead with a transducer and transducer electronics, and encoder interface electronics which exchange data and commands with the readhead and with the host computer. The transducer electronics may lack a clock capable providing a sufficiently consistent sample delay time. To provide a consistent sample delay the interface electronics measures an inherent sample delay time based on signals from the readhead during a calibration mode. The difference between the inherent delay time and the desired delay time is saved and inserted by the interface electronics during position measurement such that the calibrated sample delay time is consistently the desired sample delay time.

35 Claims, 10 Drawing Sheets

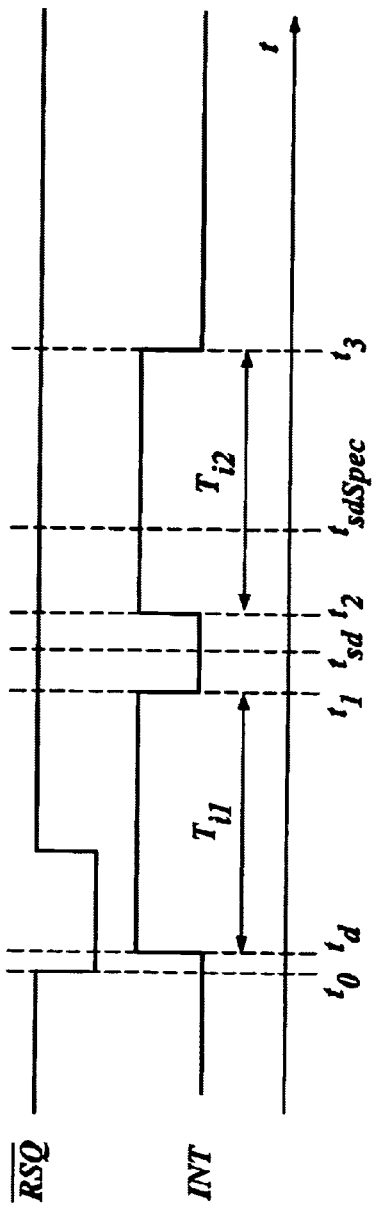
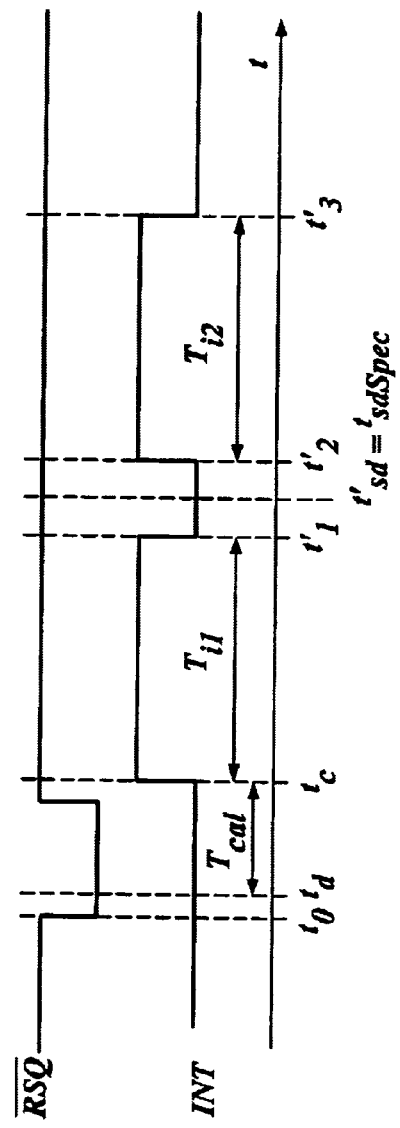

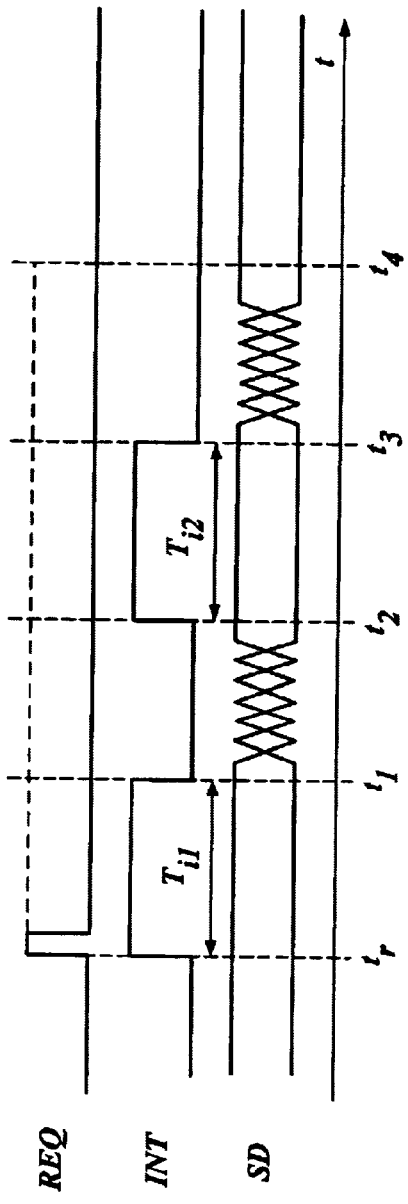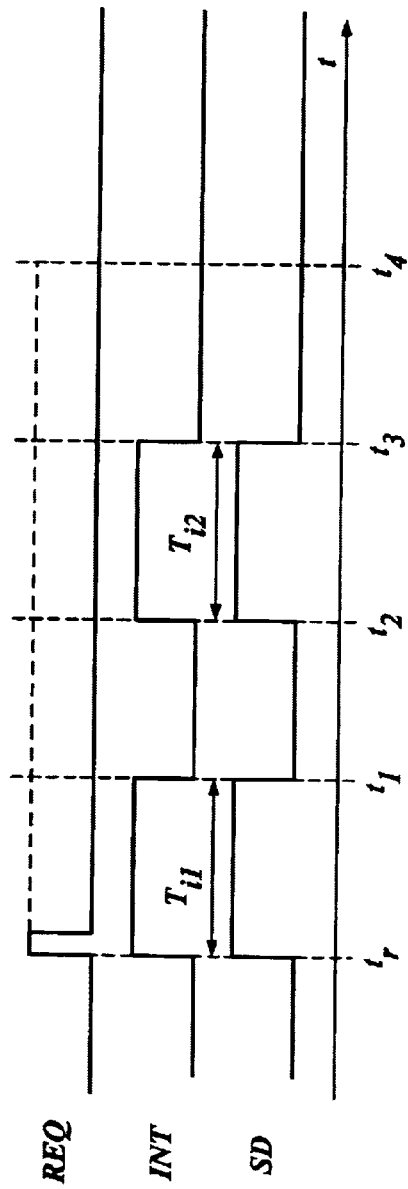

SYSTEM AND METHOD FOR DELAY CALIBRATION IN POSITION ENCODERS

FIELD OF THE INVENTION

This invention relates generally to position encoders, and more particularly to a system and method for calibrating a delay between a position request and an acquisition time in an inductive position encoder.

BACKGROUND OF THE INVENTION

Various position encoders for sensing linear, rotary or angular movement are currently available. These encoders are generally based on either inductive transducers, capacitive transducers, optical systems, or magnetic scales. In general, an encoder may comprise a transducer with a readhead and a scale. The readhead may comprise a transducer element and some transducer electronics. The transducer outputs signals which vary as a function of the position of the readhead relative to the scale along a measuring axis. The transducer electronics outputs the signals to a signal processor or processes the signals internally before outputting modified signals indicative of the position of the readhead relative to the scale. It is also common for an encoder system to include an interface electronics separate from the readhead, and to interpolate or otherwise processes the transducer signals in the interface electronics before outputting modified signals indicative of the position of the readhead relative to the scale to an external host.

Some position encoder systems communicate with an external host using a request and response process. This process may include three steps: a host computer sends a request for a position measurement; the encoder samples the output of the position transducer; and the encoder responds by transmitting position information. The delay between when the host computer sends the request for the position measurement and when the encoder samples the position transducer is called the sample delay. If the sample delay is significant, then in many applications it is important that the delay be known and constant. Knowing the amount of the delay is particularly important in certain motion control systems which use the delay information to tune the performance of their position control loop and/or estimate position corrections using velocity information. In other cases, it is simply important that the sample delay conform to the interface constraints of an existing motion controller or other host system.

One prior art patent which describes an encoder unit which accounts for processing delays is U.S. Pat. No. 5,721,546. The '546 patent teaches an encoder in which a delay time of data which is caused by analog to digital conversion and arithmetic processing time is compensated to eliminate motion-related errors to prevent deterioration of control performance. The device operates by predicting a position change that occurs during a delay time in accordance with angular data obtained from current and previous sampling cycles. The error related to delay time is then compensated for by adding the predicted position change to the current sampling data. However, the relatively complex processing in the encoder and the data interface between the encoder and host taught in the '546 patent is not desirable in a number of applications. Furthermore, the method of the '546 patent only compensates each encoder's sample delay for predicted position changes based on angular data from current and previous sampling cycles, and thus does not address other issues associated with host interface timing constraints, signal processing complexity and the like. For example, the method of the '546 does not make a sample delay time more predictable, or conveniently and economically establish a sample delay time that is to a high degree the same for a plurality of interchangeable encoders. Alternatively, it is known to make a sample delay time more predictable and establish a sample delay time that is to a high degree the same for a plurality of interchangeable encoders by including a relatively accurate high speed clock in each encoder readhead. However, there are number of applications for encoders in which the readhead size and power consumption must be reduced to a practical minimum. In such applications, significant readhead signal processing and/or including an accurate high speed clock in the readhead are effectively prohibited.

The present invention is directed to providing a method and apparatus that overcome the foregoing problems and disadvantages. More specifically, the present invention is directed to a method and apparatus for providing a calibrated delay between a position request to a position encoder and a sample acquisition time in the encoder readhead.

SUMMARY OF THE INVENTION

A system and method is provided for calibrating a delay time between a position request and an acquisition time in a position encoder system. The position encoder system includes a scale, a readhead with a transducer and transducer electronics, and interface electronics which control the readhead and obtain measurements from the readhead. The interface electronics are accessible from a host computer. The transducer of the readhead may be an inductive transducer. When an inductive transducer is used, the clock frequency used for sample acquisition may be somewhat slow and variable since it may be partially determined by the resonance between the inductance of the transducer pattern and the multiple tuning capacitors. The clock included in the interface electronics is more accurate than the clock of the readhead, and is generally used for the timing calibration procedures.

In accordance with one aspect of the invention, the sample delay time of the position encoder system is calibrated by measuring an initial sample delay time and then comparing it to a specification delay time. The difference between the initial delay time and the specification delay time is designated as the delay time calibration. The delay time calibration is saved to memory and then included in the measurement process so as to make the calibrated sample delay time the same as the specification delay time and consistent between different position encoders.

In accordance with another aspect of the invention, the sample delay time of the position encoder may be measured a number of times so that a more accurate delay time calibration for the position encoder can be determined. In one embodiment, the measurement of multiple sample delay times may reduce the uncertainty of the measurement by one-half or more. The uncertainty of the measurement is sometimes referred to as jitter. In one specific implementation of the position encoder system, the amount attributable to jitter may be reduced from plus or minus 100 nanoseconds to plus or minus 50 nanoseconds.

In accordance with yet another aspect of the invention, in one embodiment the position encoder utilizes symmetric sampling. During the symmetric sampling process, the analog transducer output signals are read and integrated over two time intervals. The sample delay time may be defined as the median time between the two integration intervals.

In accordance with still another aspect of the invention, the number of communication lines required for the position encoder readhead is kept to a minimum. This is partially accomplished by making the internal timing signal of the readhead available at the normal output of the readhead when a specific calibration process is being performed. This eliminates the need for an additional communication line for this purpose.

It will be appreciated that the disclosed systems and methods for the calibration of the sample delay time are advantageous in that they allow the calibrated sample delay to be made the same as the specification delay time and consistent between different encoder units. The systems and methods have particular utility in combination with small sized encoder readhead heads which exclude complex circuits and accurate high speed clocks.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIG. 5 is a timing diagram illustrating the operation of a position encoder before a delay time calibration has been determined;

FIG. 6 is a flow diagram illustrating the operation of a position encoder after a delay time calibration has been determined and added to the process;

FIG. 9 is a timing diagram illustrating the operation of a position encoder during a normal readhead operation mode;

FIG. 10 is a timing diagram illustrating the operation of a position encoder during a readhead calibration mode;

DETAILED DESCRIPTION OF THE PREFERRED EMBODIMENT

Figure 1:
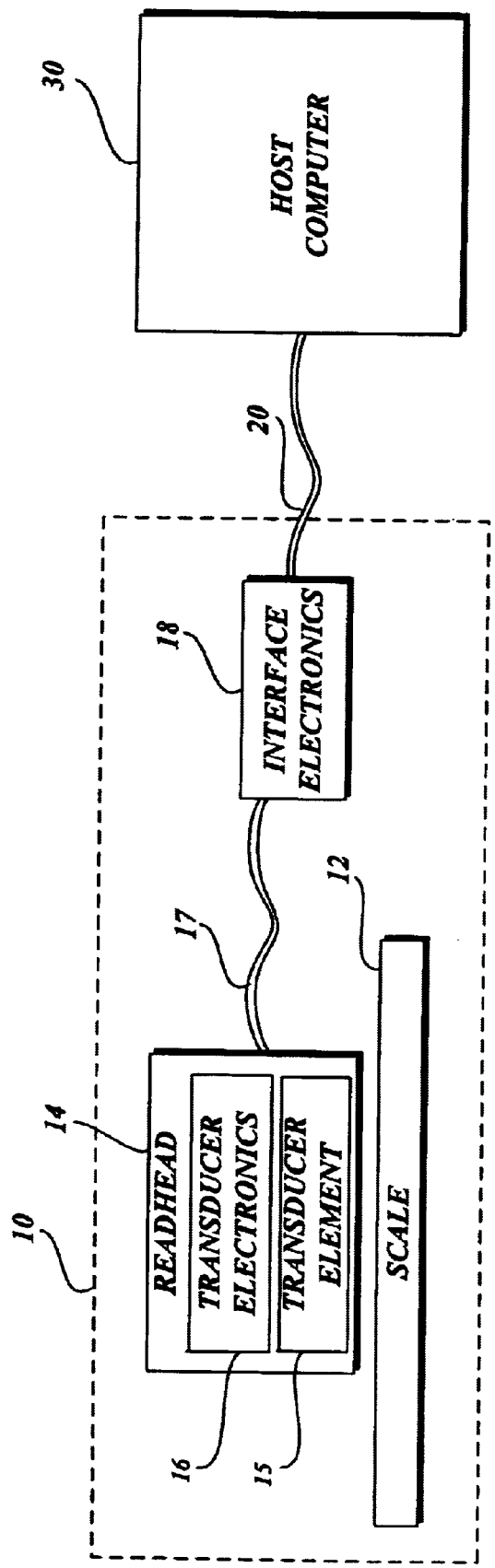
FIG. 1 is a block diagram of a position encoder system and host computer.

FIG. 1 is a block diagram of a position encoder and a host computer 30. The terms position encoder and position encoder system are generally used interchangeably herein, unless otherwise indicated. The position encoder may be any type of encoder, such as a linear position encoder intended for use by servo controllers in applications such as pick-and-place machines, fluid dispensing machines, etc. The position encoder includes a scale 12, a readhead 14, a cable 17, and interface electronics 18. The host computer may be in the form of a servo controller, and communicates via a cable to the position encoder to receive position information.

In operation, the host computer sends commands over the cable to the interface electronics 18. The interface electronics 18 communicate via the cable 17 with the readhead 14. The interface electronics 18 trigger position acquisition in the readhead 14. The readhead 14 collects signals from the scale 12 using a readhead transducer element 15, then digitizes the signals using transducer electronics 16, and sends the signals via the cable 17 to the interface electronics 18. In a preferred embodiment, the interface electronics 18 compute a position from the signals, and sends the position information to the host computer via the cable 20. As an alternative, in various exemplary embodiments all or part of the interface electronics 18 may be configured as a plug-in card and/or embedded software routines or the like, and included in the host computer 30. In such cases the cable may be eliminated.

It should also be appreciated that other types of connections between the transducer electronics 16 and the interface electronics 18 are within the scope of this invention. For example, the readhead 14 may receive power from a separate connection (not shown), and the transducer electronics 16 and the interface electronics 18 may be connected by any now known or later developed wireless communication methods. Also, when an application does not restrict the volume available in and around the readhead 14, the interface electronics 18 may be included in or adjacent to the readhead 14, and the cable 17 may be eliminated or replaced by any other appropriate type of connection.

As noted above, the position encoder and host computer operate in a request and response format. This process includes three steps. First, the host computer sends the request for position. Then, the encoder system samples the position transducer. Finally, the encoder system responds by transmitting position information. The delay between the first and second steps, between when the request for position is sent and when the encoder samples the transducer, is called the sample delay.

As also noted above, in a variety of applications it is important that sample delay be known and constant. Knowing the amount of the delay is particularly important in certain motion controllers which are designed in a way that impose constraints on the delay time variation and/or that tune the performance of the position control loop based on a specified sample delay. An uncertainty in the amount of delay translates into to an uncertainty in a position, speed, or acceleration when a positioning system is moving. Sample delay can arise, for example, because the transducer output signals are integrated over a period of time (to improve the signal to noise ratio), and/or the encoder may implement symmetric sampling (CDS) so that the response is based on two samples instead of one. An exemplary embodiment of an encoder utilizing symmetric sampling is described in U.S. Pat. No. 6,304,832, which is commonly assigned and hereby incorporated by reference in its entirety.

In one embodiment, the position encoder may utilize both integration and symmetric sampling. In addition, the transducer that is utilized in the readhead 14 may be an inductive transducer. Various exemplary embodiments of inductive transducers usable in combination with this invention are described in U.S. Pat. Nos. 6,011,389, and 6,005,387, which are commonly assigned and hereby incorporated by reference in their entirety. In such a case, the readhead clock frequency used for signal acquisition in the readhead 14 may be somewhat variable between units, because it is determined by the resonance between the inductance of the transducer pattern and multiple tuning capacitors. Thus, the tolerance of the tuning components is such that the sample delay may vary outside desired specifications. However, the readhead clock frequency will generally be fairly constant over time, especially when tuning components with low temperature coefficients are used. In such a case, once the sample delay timing has been determined for a unit, it will remain relatively constant for a certain amount of time. In one embodiment, a desired position sample timing variation of less than plus or minus 250 nanoseconds is to be provided between position samples and between encoder units. In the absence of an accurate clock signal in the encoder readhead, calibration is important for achieving timing consistency at such levels. As will be described in more detail below, the system and method of the present invention is directed towards calibrating the sample delay of an encoder so that there will be minimal variations between units, even when the encoder has a relatively inaccurate readhead clock.

Figure 2:
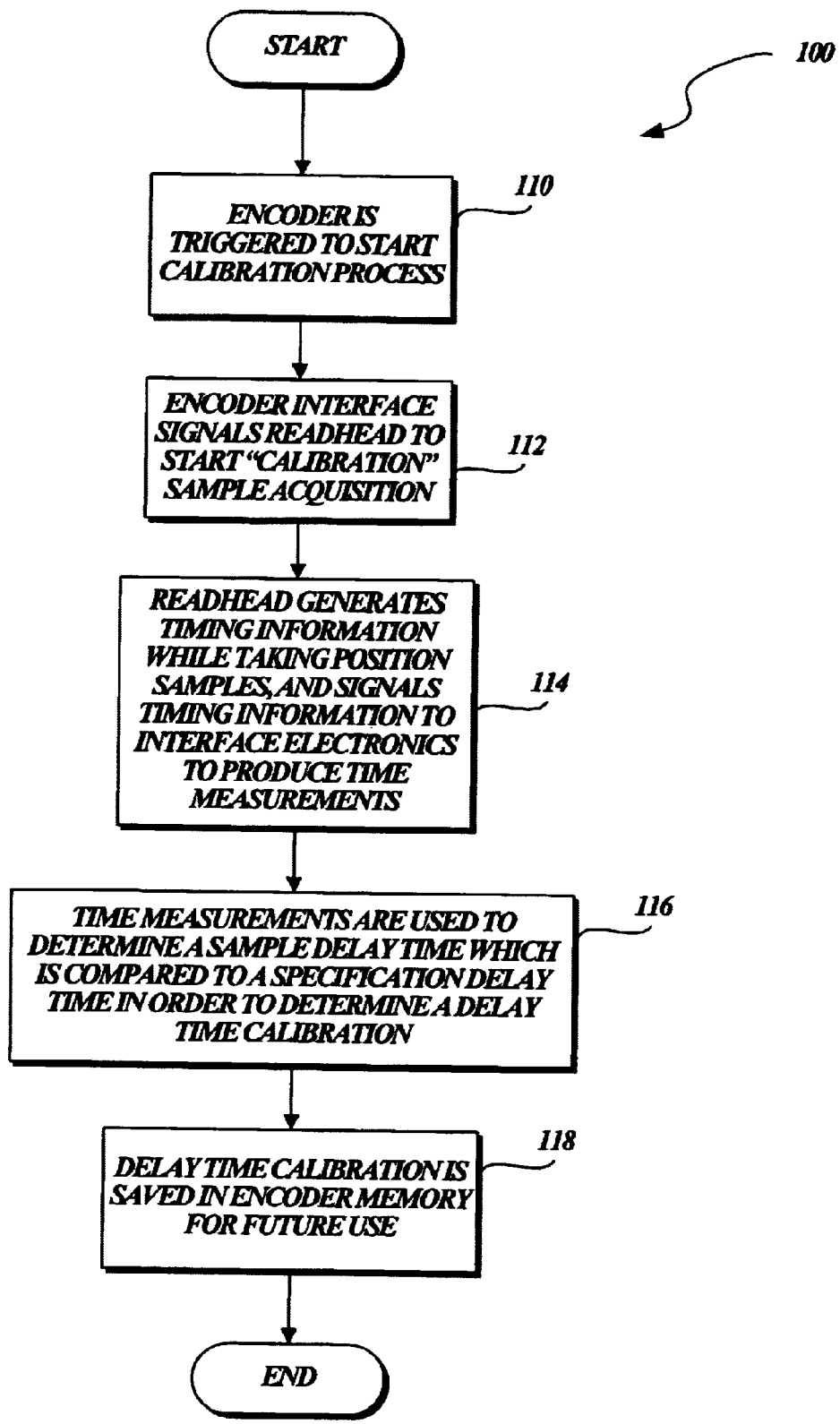
FIG. 2 is a flow diagram of a calibration routine.

FIG. 2 is a simplified flow diagram of a calibration routine 100 in accordance with the present invention. At a block 110, the encoder system is triggered to start the calibration process. In various exemplary embodiments, a host computer sends a calibration-starting command to trigger the calibration process. In other exemplary embodiments, a position request or other signal from the host is processed by the encoder based on an internal state of the encoder, such as a sleep/wake up state or the like, to trigger the calibration process. In yet other embodiments, an internal state of the encoder such as a power on, reset, or elapsed time or the like, triggers the calibration process. At a block 112, the readhead interface circuitry portion of the encoder circuitry signals the readhead to start the "calibration" sample acquisition and also starts a relatively accurate clock cycle counter or records a relatively accurate time value which will be used to determine the actual sample delay time as discussed in more detail below. Operation then continues at block 114.

At a block 114, the readhead generates timing information while sampling the transducer position signals according to the normal sequence of sample operations of the readhead. The generated timing information is signaled to the readhead interface circuitry. In one exemplary embodiment, the readhead generates the timing information by simply coupling certain normally occurring signals in the transducer electronics to signal lines connected to the readhead interface circuitry, as described further below, to control the clock cycle counter or a time value recording to produce time measurement values related to the timing signals. More generally, the encoder electronics, for example the readhead interface electronics, may use any appropriate now known or later developed time measurement method, provided that the encoder system produces accurate time measurement values corresponding to the timing signals generated by the readhead.

It should be appreciated that, in various exemplary embodiments, when performing the "calibration" sample acquisition and timing signal generation, the readhead may omit certain other "normal mode" operations to the extent that they do not affect the normal sequence of sample operations of the readhead. For example, in various exemplary embodiments, digital conversion of the sampled transducer position signals is performed between samples or after the sampling is completed, and thus may be omitted during "calibration" sample acquisition and timing signal generation. Accordingly, in various exemplary embodiments, the readhead transducer electronics transmits just the generated timing information to the readhead interface circuitry, omitting the position sample information that is transmitted during "normal mode" operations.

Next, at a block 116, the time measurement values produced at block 114 are processed by the encoder electronics to calculate a sample delay time. Various exemplary sample delay time calculations are described further below. The sample delay time is compared to a specification delay time stored in the host computer or encoder electronics in order to determine a delay time calibration. Determination of the delay time calibration is discussed in detail further below. Then, at a block 118, the delay time calibration is saved in the encoder system memory for future use, for example during normal operation of the encoder, as will be described in more detail below with reference to FIG. 6.

The calibration process ends after the operations at block 118, and in an exemplary embodiment the encoder automatically enters a normal position indicating mode of operation. Alternatively, in a further exemplary embodiment, at least the operations described with reference to blocks 112–116 of FIG. 2 are repeated a number of times (e.g., 10, 20, 50 or 100 times) and the sample delay times determined repeatedly at block 116 are averaged by the encoder electronics to provide an average sample delay time, which is used to determine the delay time calibration. As will be described in more detail below, this averaging process can reduce the uncertainty in the sample delay time measurement, and therefore provide a more accurate delay time calibration.

Figure 3:
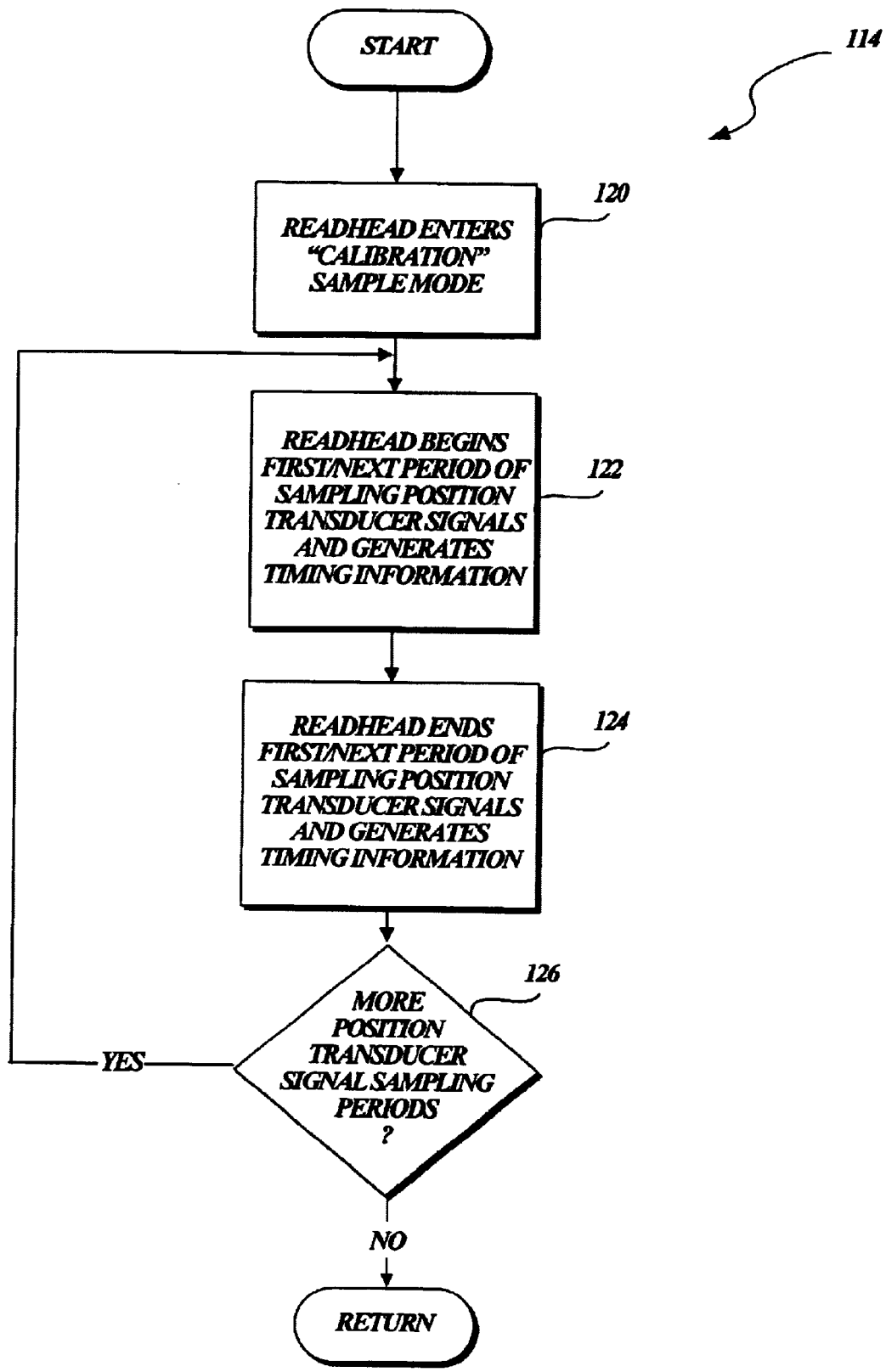
FIG. 3 is a flow diagram of a sample acquisition routine utilizing symmetric sampling.

FIG. 3 is a flow diagram of one exemplary embodiment of a "calibration" sample acquisition routine 114, usable by the readhead with reference to the readhead portion of the operations of block 114 of FIG. 2. The calibration sample acquisition routine 114 of FIG. 3 is directed to a position encoder which utilizes a signal integration period for sampling the position transducer signals. However, it should be appreciated that this is an exemplary embodiment only and is intended to be illustrative, not limiting, of the various operations which may be performed at the block 114 of FIG. 2 for various other embodiments which use alternative sampling methods with various alternative position transducers. As shown in FIG. 3, at a block 120, the readhead of the encoder enters a "calibration" sample acquisition mode. For example, in various exemplary embodiments, lines which carry digitized position sample information to the readhead interface circuitry during a normal mode of operation may instead be configured to carry the timing signals generated during the calibration sample acquisition mode. However, it should be appreciated that in various other exemplary embodiments, depending on the configuration of the readhead interface circuitry, the number of its connections to the readhead, and/or various other system design choices, the readhead may be compatible with this invention while having only a single operating mode, and the operations of block 120 may be omitted.

At a block 122, the readhead begins a first or next sampling period for sampling the position transducer signals, according to a normal sampling sequence and generates a timing signal associated with the sampling period. For example, a first position transducer signal integration period is started and an associated timing signal is simultaneously sent to start or otherwise determine a time measurement in the readhead interface electronics.

At a block 124, the first/next sampling period for sampling the position transducer signals is ended according to the normal sampling sequence and the readhead generates a timing signal associated with the sampling period. For example, a first position transducer signal integration period is ended and, depending on the time measurement technique used, an associated timing signal may be simultaneously sent to end or otherwise determine a time measurement in the readhead interface electronics.

Next, if the normal sampling sequence includes multiple sampling periods, for example for sample averaging or for a sampling method such as the symmetric sample described further below, a decision block 126 is included in the routine 114. At the decision block 126, it is determined if there are any more sample periods remaining in the normal sampling sequence. If a sample period remains in the normal sequence, the routine returns to operations at block 122. If all sample periods are complete, the routine ends and control returns to the next overall calibration step.

Generally speaking, for a system which uses a single position transducer signal integration period, such as the one described above, the midpoint of the integration time period is a reasonable estimate of the time that should be associated with the position value resulting from the integrated signal samples. Thus, the midpoint of the integration time period defines the sample delay time, previously discussed with reference to block 116 shown in FIG. 2, which should be associated with a position sample request for such a system. The midpoint of the integration time period is easily determined based on the operations of the routines described above. As will be appreciated by one of ordinary skill in the art, this discussion assumes a relatively constant position transducer speed during the integration period, which is a reasonable assumption for many transducer systems.

For other sampling sequences, other methods of calculating the appropriate sample delay time will be apparent to one of ordinary skill in the art, the essential point being that the position request time plus the sample delay time should reasonably represent the time that encoder was actually at the position indicated by the position value resulting from the transducer signal samples. An exemplary symmetric sampling method and the related sample delay time determination is described in detail further below.

Figure 4:
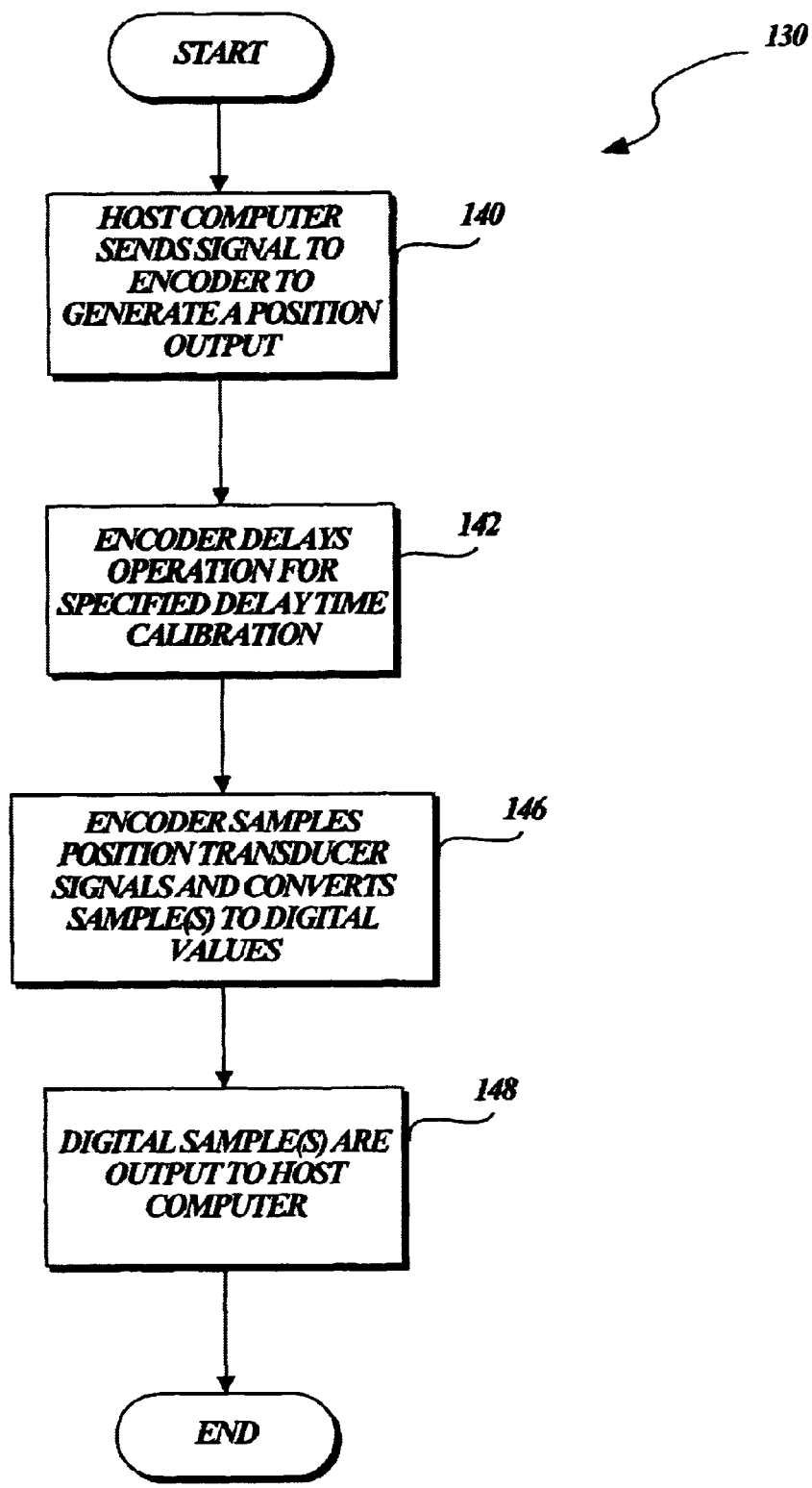
FIG. 4 is a flow diagram of a normal operation routine that is utilized after a delay time calibration has been determined.

FIG. 4 is a flow diagram of a normal operation routine 130, executed during a normal operation mode, which may follow the calibration routine of FIG. 2. As shown in FIG. 4, at a block 140, the host computer sends a request signal to the encoder system to generate a position output. At a block 142, the encoder system delays the process for the specified delay time calibration, as was computed and saved to memory with reference to blocks 116 and 118 of FIG. 2. At a block 146, the encoder samples the position transducer signals according to the normal sampling sequence and converts the sample(s) to digital values. At a block 148, the digital sample values are output to the host computer.

FIGS. 5 and 6 are timing diagrams illustrating the operation of an exemplary embodiment of the position encoder that utilizes symmetric sampling, and which implements the methods described above with reference to FIGS. 2–4. As described in detail in the incorporated '832 patent, symmetric sampling is a method sequentially collecting multiple position transducer signal channels. Briefly, for symmetric sampling, each signal channel is sampled twice—once at a respective time interval before a synthetic sample time and at the same respective time interval after the synthetic sample time. Thus, it is possible for each signal channel to have the same effective synthetic sample time, which corresponds to a single position, such that the multiple signal samples may be properly combined for determining that position.

FIGS. 5 and 6 show the timing of two signals RQS and INT. The signal RQS is a position request signal generated by the host computer, while the signal INT is an internal signal inside the readhead transducer electronics. FIG. 5 shows an "uncalibrated" timing, such as would be observed during the calibration process described with reference to FIGS. 2 and 3. FIG. 6 shows a calibrated timing according to this invention, such as would be observed during the normal position-determining operation described with reference to FIG. 4. As illustrated in FIG. 5, the host computer starts the process at a time $t_0$ by sending a position request pulse on the RQS signal line (which is defined as active low), to the position encoder. At a time $t_d$ (which is a short time after time $t_0$), as indicated by the signal INT going high, the readhead transducer electronics begin to sample the transducer signals. The time delay between the time $t_0$ and the time $t_d$ includes any inherent minimum signal delays and startup periods required for the readhead to receive a relayed sample request from the portion of the encoder electronics which acts as the interface to the readhead, as well as any time required for the transducer electronics to actually start the sample acquisition after receiving the relayed sample request.

While the signal INT is high, during an integration interval $T_{i1}$, the readhead transducer electronics front-end reads and integrates the analog transducer output signal. This is the first of two samples in the symmetric sampling sequence. At a time $t_1$, the integration of the first sample ends and the readhead transducer electronics holds the sample for conversion to a digital value. At a time $t_2$, acquisition of the second sample in the symmetric sampling sequence begins. Integration of the second sample continues for an integration interval $T_{i2}$. At a time $t_3$, the integration of the second sample ends and the readhead transducer electronics holds the second sample for conversion to a digital value. It should be appreciated that each sampled and held signal effectively captures the actual transducer position(s) for the corresponding sample time period. Therefore, these are the respective times and transducer positions which have a relation that is relevant to the sample delay time and delay time calibration. The digital value conversion process has no such direct relation to the transducer position. Therefore, the digital value conversion process and associated data transmission is not discussed in detail herein as various methods for performing the digital value conversion process and associated data transmission will be apparent to one of ordinary skill in the art.

As shown in FIG. 5, a sample delay time $t_{sd}$ is defined as being the, median between the end of the first integration interval $T_{i1}$ and the start of the second integration interval $T_{i2}$. As will be described in more detail below, a desired specification delay time $t_{sdspec}$ is also illustrated. With regard to the inherent sample delay time $t_{sd}$, using the times $t_1$ and $t_2$, the inherent sample delay time $t_{sd}$ can be calculated according to the following equation:

$$t_{sd} = \frac{t_1 + t_2}{2} \qquad \text{(Eq. 1)}$$

In one embodiment, the processor embedded in the interface electronics of the encoder may be a digital signal processor or a micro controller, and the interface electronics may use a relatively precise clock oscillator based on a quartz crystal. Such oscillators are known for their high frequency and precision. In one embodiment, the interface electronics clock has a period on the order or 10 nanoseconds and can therefore be used to measure times $t_1$ and $t_2$ to a similar high degree of accuracy. It should be noted that the remote electronics processor's quartz oscillator is not the same as the readhead oscillator used for locally driving the sample acquisition. As previously mentioned, particularly small or economical readheads often use local oscillators which are stable but lower speed and/or not calibrated. Thus, the relatively more accurate and higher speed clock included in the interface electronics is used for timing measurements and calibration procedures according to this invention.

While the encoder system is in the timing calibration mode, it may send one or more calibration request pulses to the readhead, and measure the corresponding times $t_1$ and $t_2$. Based on these measurements, the encoder system will compute the inherent sample delay time $t_{sd}$ according to Equation 1. As discussed further below, the computed inherent sample delay time $t_{sd}$ includes some uncertainty related to the relatively slow readhead clock used for sample timing in the readhead. To reduce this uncertainty, in one embodiment the timing calibration may be performed utilizing multiple samples (e.g., 100) so as to obtain a more accurate average sample delay. As discussed further below, in one exemplary embodiment this allows the uncertainty to be reduced from plus or minus one readhead clock period to approach approximately plus or minus one-half the readhead clock period. For one exemplary readhead clock period of 100 nanoseconds, this averaging reduces the uncertainty to approach approximately plus or minus 50 nanoseconds. The specification delay time $t_{sdspec}$ is then compared to the inherent sample delay time $t_{sd}$ in order to determine a delay time calibration $T_{cal}$.

The desired specification delay time $t_{sdspec}$ is generally defined relative to the time $t_0$ of the RQS signal and generally depends on the particular inherent sample delay time $t_{sd}$ that can be achieved with the particular position transducer design. It is desirable that the specification sample delay time $t_{sdspec}$ be selected with enough delay to accommodate the variation in the inherent sample delay time $t_{sd}$ that occurs for a particular position transducer design due to various component variations that may occur during manufacturing. In one exemplary embodiment an absolute inductive transducer using a symmetric sampling method may have a nominal inherent sample delay time $t_{sd}$ of approximately 6 microseconds. In such a case, the desired specification delay time $t_{sdspec}$ may be, for example, approximately 10 microseconds or less, but more than 6 microseconds plus the expected variation from encoder to encoder. More generally, in many motion control applications, the desired specification delay time $t_{sdspec}$ is as short as allowed by the expected inherent sample delay time. The encoder system saves the delay time calibration $T_{cal}$ to memory. The delay time calibration $T_{cal}$ can be calculated according to the following equation:

$$T_{cal} = t_{sdspec} - t_{sd} \quad \text{(Eq. 2)}$$

In one exemplary embodiment, the timing calibration can be performed in the field every time the encoder power is turned on, or upon request from the host system or a user. In another exemplary embodiment, it may be performed only once during the last stage of a position encoder's production. However, by performing the timing calibration more frequently in the field, long-term calibration drift may be removed from the sample acquisition timing.

FIG. 6 is a timing diagram similar to FIG. 5, except having a delay time calibration $T_{cal}$ added near the beginning of the signal INT. The adding of the delay time calibration $T_{cal}$ makes the calibrated sample delay time $t'_{sd}$ correspond to the specification sample delay time $t_{sdspec}$. Similar to FIG. 5, the host computer starts the process at time $t_0$. However, in the case of FIG. 6, the encoder interface electronics, based on the relatively high accuracy clock, waits for a time period equal to the delay time calibration $T_{cal}$ before relaying the sample request signal to the transducer electronics. This effectively adds the delay time calibration $T_{cal}$ to the inherent minimum signal delay time period $t_d$, before the readhead transducer electronics begins to sample the transducer signals, as indicated by the signal INT going high at a time $t_c$ in FIG. 6. Then operation continues as described above with reference to FIG. 5, with the first integration period $T_{i1}$ until a time $t'_1$, and the second integration period $T_{i2}$ from a time $t'_2$ until a time $t'_3$. Based on these operations, as indicated in FIG. 6, the calibrated sample delay time $t'_{sd}$ is made equal to the desired specification sample delay time $t_{sdspec}$ as closely as possible.

It should be appreciated that for the examples shown in FIGS. 5 and 6, the sample delay time $t_{sd}$ is shown that best corresponds to the position value based on the position transducer samples acquired during the first integration interval $T_{i1}$ and the second integration interval $T_{i2}$ during symmetric sampling. More generally, other sample schemes may be used with various transducers. It should be appreciated that in each such case, there is a sample delay time that best corresponds to the position value based on the position transducer samples, and that sample delay time is generally the sample delay time which should be calibrated using the systems and methods according to this invention.

With regard to a position encoder utilizing the methods of FIGS. 5 and 6, an additional design consideration is related to the method used to start the readhead local oscillator which provides a periodic signal that governs readhead operations (i.e., the local oscillator which includes the transmitter winding in the exemplary inductive encoder referred to above). In one embodiment, the readhead oscillator is made to be running before the pulse on the signal RQS. A benefit of this embodiment is that the acquisition oscillator does not need to be started upon the reception of the pulse on the signal RQS, thereby eliminating the oscillator startup delay. A drawback of this embodiment is that the acquisition clock may be unsynchronized with the processor clock, resulting in slight uncertainty in the inherent delay time $t_d$, and thus, the sample delay time $T_{sd}$. This uncertainty will appear as "jitter" in the timing signals of the readhead relative to timing signals in the encoder interface electronics. This jitter is generally not removed by calibration. However, a large number of samples (e.g., 100) may be measured so as to average the "jitter" and find an average value of the sample delay time $T_{sd}$. In one embodiment, this may allow the uncertainty to be reduced to approach 50 nanoseconds instead of plus or minus 100 nanoseconds, given a 100 nanosecond readhead sample clock period.

The accuracy of the calibration described above depends on several factors. Since the interface electronics clock used for the measurement values which determine the inherent sample delay time may introduce uncertainties as small as 10 nanoseconds or less, the uncertainty in the measured and computed inherent sample delay time $t_{sd}$ is dominated by the uncertainty related to the relatively slow readhead clock period, which may be on the order to 50–100 nanoseconds, as described above. Furthermnore, the specification sample delay time $t_{sdspec}$ includes no uncertainty and the delay time calibration $T_{cal}$ may be determined and implemented with the resolution of the accurate interface clock period, e.g.—10 nanoseconds. Accordingly, the accuracy or uncertainty of the calibration described above may be approximately the uncertainty related to the relatively slow readhead clock period, plus a small additional amount on the order of the accurate interface clock period. Thus, relative to a nominal value, the uncertainty in the position sample delay time may be less than the period of the readhead clock oscillator in various exemplary embodiments according to this invention.

In an alternate embodiment, the readhead oscillator is not oscillating before the request pulse on the RQS signal line, and is started by the interface electronics when RQS signal pulse arrives. A benefit of this embodiment is that the sample clock is generally synchronized to a higher degree with the processor clock, removing much of the jitter in the sample delay time $t_{sd}$. One drawback of this embodiment is that it takes longer to start the oscillator, therefore the inherent delay before initiating sampling is longer. In one implementation, the additional time to start the oscillator may be about 1 microsecond, and the specification sample delay time $t_{sdspec}$ is compatible with such an additional delay. In one embodiment where the transmitter winding oscillator of the previously described inductive transducer is started by the encoder when the RQS signal pulse arrives, the readhead clock start up is very repeatable and the inherent sample delay time $t_{sd}$ may therefore be determined to within an uncertainty of approximately the accurate interface clock period, e.g.—10 nanoseconds. In such as case, relative to a nominal value, the accuracy or uncertainty of the sample delay time calibration may be much less than the period of the readhead clock oscillator, and may be as small as approximately a few times the accurate interface clock period in various exemplary embodiments according to this invention.

An additional source of jitter may occur if the processor clock in the interface electronics is not synchronized with the host computer clock. However, this effect would generally be small when the processor clock period is small (e.g., 10 nanoseconds) and is therefore not discussed herein.

FIGS. 7–10 illustrate the specific operations of an exemplary readhead 14, which may be an inductive readhead as described further below. With reference to FIG. 1, the methods of FIGS. 7–10 help reduce the number of connections that couple the interface electronics 18 to the readhead 14, for example to limit the number of wires in the cable 17 and any associated connectors. In one embodiment, the cable 17 may be 3–10 meters long, and it is desirable to reduce the number of wires in the cable. The cable 17 may carry three signals (excluding power and ground), one for the sample request pulse, one for the transmission of digitized data from the readhead, and one for the serial clock used with the data signal. In an embodiment where the signaling rate is high (e.g., 10 megahertz) the clock signal is important for achieving the desired levels of data integrity (i.e., a synchronous signaling scheme as opposed to an asynchronous).

Figure 7:
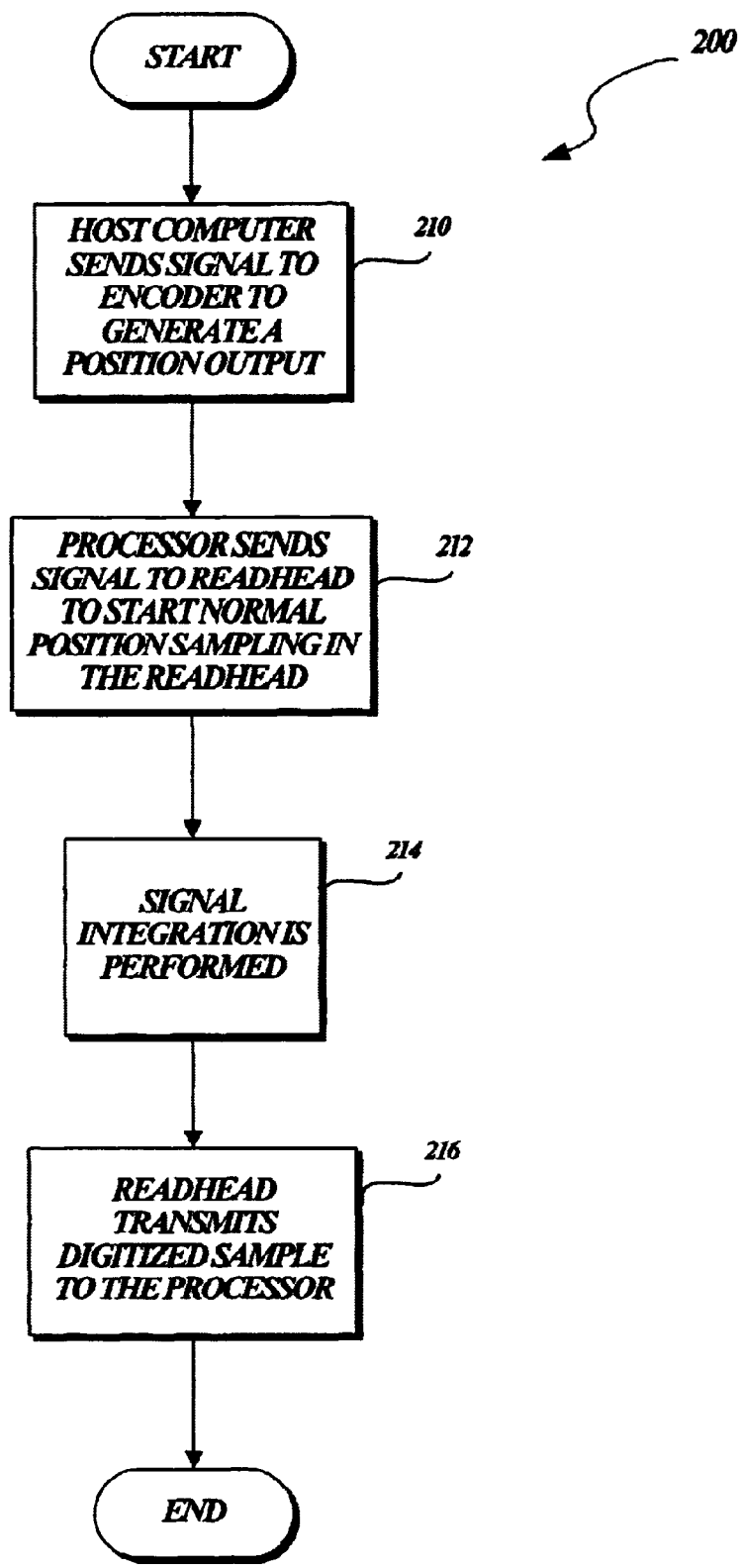
FIG. 7 is a flow diagram of a normal readhead operation routine.
Figure 8:
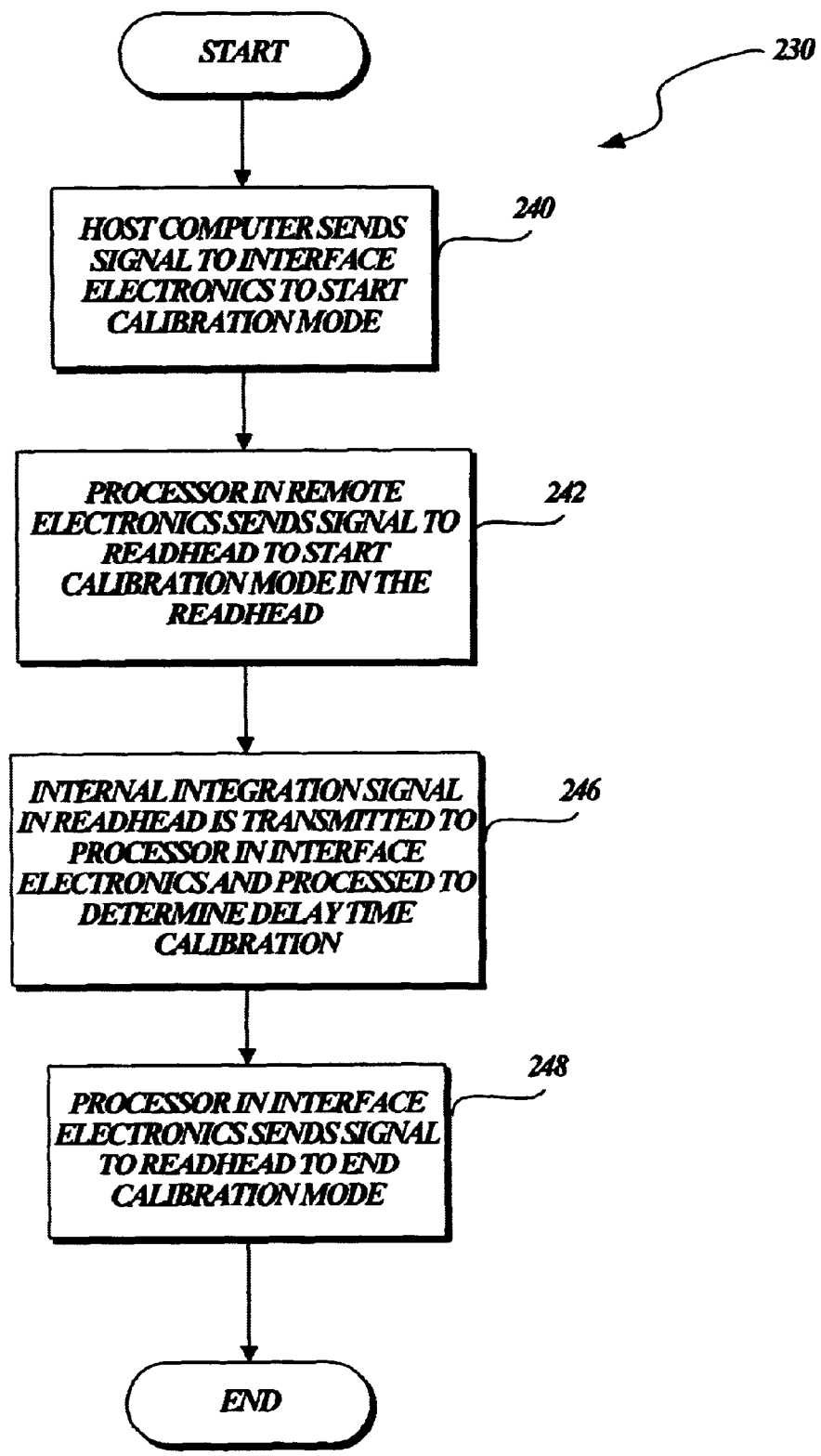
FIG. 8 is a flow diagram of a readhead calibration routine.

In the embodiment of FIGS. 7–10, the position encoder extends the use of the above-described signals to also include a time calibration mode in addition to the other setup information for the readhead. As will be described in more detail below, FIGS. 7 and 8 are flow diagrams illustrating the readhead's normal operation routine and calibration routine, while FIGS. 9 and 10 are timing diagrams illustrating the readhead's normal operation mode and calibration mode.

FIG. 7 is a flow diagram illustrating a normal readhead operation routine 200. In a normal operating mode, at a block 210, the host computer sends a request signal to the encoder system to generate a position output. At a block 212, the processor in the interface electronics sends a signal to the readhead to start a normal position sampling operation in the readhead. The signal timing from the interface electronics includes any operative delay time calibration, $T_{cal}$, as described above with reference to FIG. 6. At a block 214, signal integration is performed to sample the position transducer signals (e.g., as described above with reference to FIGS. 5 and 6). At a block 216, the analog-to-digital converter of the readhead converts the sampled signals and the readhead transmits the digitized sample to the processor in the interface electronics, and the routine then ends.

FIG. 8 is a flow diagram illustrating a readhead calibration routine 230. In the embodiment shown in FIG. 8, at a block 240, the host computer initiates a calibration mode by sending a signal to the encoder interface electronics. At a block 242, the processor in the interface electronics sends a signal to the readhead to start the calibration mode in the readhead. At a block 246, the readhead follows a typical position transducer sampling sequence and the internal signals in the readhead corresponding to important features of the sampling sequence are transmitted from the readhead to the processor in the interface electronics and measured and/or processed to determine the delay time calibration. As will be described in more detail below, in the present embodiment, the integration signal that is normally internal to the readhead is specifically made available to the processor in the interface electronics. At a block 248, the processor in the interface electronics sends a signal to the readhead to end the calibration mode and the routine ends. In an alternative embodiment, the readhead automatically ends the calibration mode following the expected transmission sequence of timing signal information, without further signals from the readhead. In another alternative embodiment, the processor in the interface electronics and the readhead cooperate to repeat at least the operations described with reference to block 246, to determine a delay time calibration based on an average sample delay, as described previously.

FIG. 9 is a simplified timing diagram illustrating the pertinent readhead signals for a normal operation mode of the exemplary readhead. As shown in FIG. 9, at a time $t_r$, a short pulse on a REQ signal line is generated by the processor in the interface electronics, usually in response to the host computer's transition of the signal RQS and is sent to the readhead coinciding with the time $t_c$ described above with reference to FIGS. 5 and 6. In the exemplary embodiment shown in FIGS. 9 and 10, the signal REQ pulse starts the signal acquisition in the readhead with negligible further delay in the readhead. The readhead signal INT, which in one embodiment is generally available only internally within the readhead, is high during the signal integration for an integration interval $t_{i1}$, until a time $t_1$. A second integration interval $T_{i2}$ begins at a time $t_2$ and ends at a time $t_3$. After each of the integration intervals $t_{i1}$ and $T_{i2}$, the analog-to-digital converter converts the integrated signals and the readhead transmits the digitized position sample information, shown schematically as the differential signal SD in FIG. 9, to the processor of the interface electronics. The serial signal SD is sent on a data signal line and corresponding synchronizing signals SC (not shown) are also generated by the readhead and sent to the interface electronics on separate clock signal line. Various alternative now known or later developed data transmission techniques may be used. FIG. 9 also illustrates an exemplary method that may be used to signal the readhead to enter a setup mode without using additional signal lines. With regard to the signal REQ, a dashed line indicates how the signal may be asserted high until the last digital data transmission has occurred. Keeping the signal REQ high is how the processor in the interface electronics signals the readhead to enter the setup mode, one of the functions of which includes the sample timing calibration mode. When the readhead detects that the signal REQ is high at the end of a normal sample cycle, it enters the readhead setup mode. In this setup mode, the processor in the interface electronics can initiate the timing calibration function by sending any required setup data on the SD signal line, which is then transmitted from the interface electronics to the readhead.

FIG. 10 is a timing diagram illustrating how the sample calibration mode alters the signals sent from the readhead. In general, in the sample calibration mode the usual analog-to-digital converter data is not transmitted on the SD signal line. Instead, the signal INT takes its place. In other words, as illustrated in FIG. 10, the signal on the SD signal line is identical to the signal INT. This allows the processor in the interface electronics to have access to the signal INT so that the timing of the signal INT can be measured, and the inherent sample delay time determined, as described above with reference to FIG. 5. To terminate the sample calibration mode in the readhead, the processor in the interface electronics again sends a long pulse on the signal REQ as indicated by the dashed line REQ signal shown in FIG. 10. When the readhead detects that the signal REQ is high at the end of a calibration sample cycle, it returns to the normal mode of operation. In an alternative embodiment, instead of the long pulse on the signal REQ, a separate calibration-ending signal is transmitted in order to terminate the calibration mode.

Figure 11:
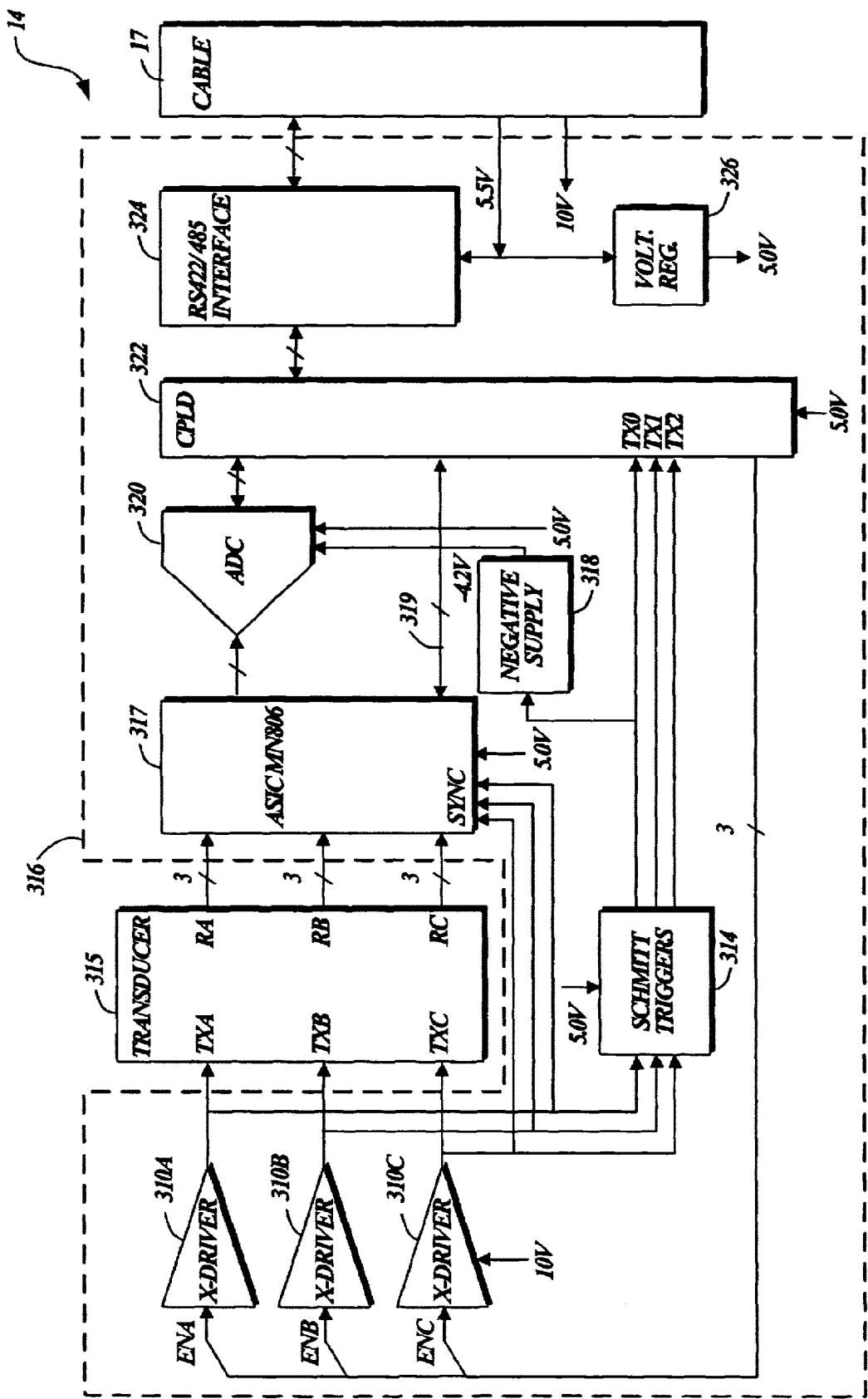
FIG. 11 is a block diagram of a readhead circuit.

FIG. 11 is a block diagram of one exemplary embodiment of a readhead 14, including an exemplary transducer electronics 316 and an exemplary readhead transducer element 315. The readhead transducer element 315 is the readhead portion of a 3-track absolute inductive position transducer such as that disclosed in the incorporated '832 patent. The transducer electronics 316 includes transmitter drivers 310A, 310B, and 310C, each of which receives a digital input signal ENA, ENB, and ENC, respectively, which enable the drivers. The drivers generate sine-wave signals that are input to respective transmitter windings TXA, TXB, and TXC of the readhead transducer element 315. Only one driver, corresponding to one track of the absolute inductive position transducer, is enabled at one time. In one embodiment, the sine-wave that is generated by the drivers may be in the frequency range of 10–16 megahertz, and this sine wave is also used as the readhead local oscillator which governs readhead operations, as described further below. A respective scale track (not shown) of the inductive position transducer modulates the amplitude of the transmitter signal as a function of position, and a respective set of receiver windings of the readhead transducer element 315 outputs the modulated signal amplitudes on respective sets of receiver pins RA, RB, or RC. In the embodiment shown in FIG. 11, each respective set of receiver pins corresponds to 3 receiver windings, corresponding to one track of the absolute inductive position transducer.

The respective sets of receiver pins RA, RB and RC are coupled to an application specific integrated circuit 317. The application specific integrated circuit 317 multiplexes the signals as needed, and then demodulates them to determine their respective signal amplitudes. The application specific integrated circuit 317 then amplifies and integrates the phase signals before they are multiplexed to the output of the application specific integrated circuit 317. The application specific integrated circuit 317 uses attenuated versions of the transmitter signals on its inputs SYNC to drive its synchronous demodulator.

A complex programmable logic device 322 communicates with the application specific integrated circuit 317 over one or more signal connections 319 and stimulates the application specific integrated circuit 317 to acquire the samples in a given sequence, then to output the samples, one at a time, to a differential analog-to-digital converter 320. The differential analog-to-digital converter 320 converts the analog signals to digital, and then clocks the data out on a serial port to the complex programmable logic device 322. It should be appreciated that the operations of the application specific integrated circuit 317 and the differential analog-to-digital converter 320 may alternatively be combined into a single signal processing circuit that inputs analog signals from the position transducer element 315 and outputs corresponding digital data to the complex programmable logic device 322. The complex programmable logic device 322 passes the data to the interface chip 324, which outputs signals to the interface electronics via the cable 17 or alternative connections as previously described. The signal connections 319 may also carry internal timing signals (such as the signals INT previously described with reference to FIGS. 5, 6, 9 and 10) from the application specific integrated circuit 317 to the complex programmable logic device 322. Thus, during a calibration operating mode of the readhead 14, the complex programmable logic device 322 may pass the timing signals to the interface chip 324, which outputs the signals to the interface electronics via the cable 17 or alternative connections as previously described.

In operation, a sample sequence is started by the interface electronics by sending a pulse on a REQ signal line (not shown) to the readhead 14 via the cable 17. The complex programmable logic device 322 detects the pulse and begins the sample sequence. The complex programmable logic device 322 controls the transmitter drivers 310A, 310B, 310C, the application specific integrated circuit 317, and the analog to digital converter 320, to produce samples in a predetermined sequence.

The periodic transmitter signals at the outputs of the transmitter drivers 310A, 310B, and 310C are used as the readhead local oscillator which governs readhead operations, as previously mentioned. The signals are converted from analog to digital clock signals by three Schmitt triggers 314. The complex programmable logic device 322 is coupled to clock signals from the Schmitt triggers 314 and selects the appropriate clock signal TX0–TX2 depending on which driver is enabled. The selected clock is used to clock the state machines inside the complex programmable logic device 322. This configuration is designed such that the state machines are generally synchronized with the application specific integrated circuit 317, so that proper timing can be maintained.

Figure 12:
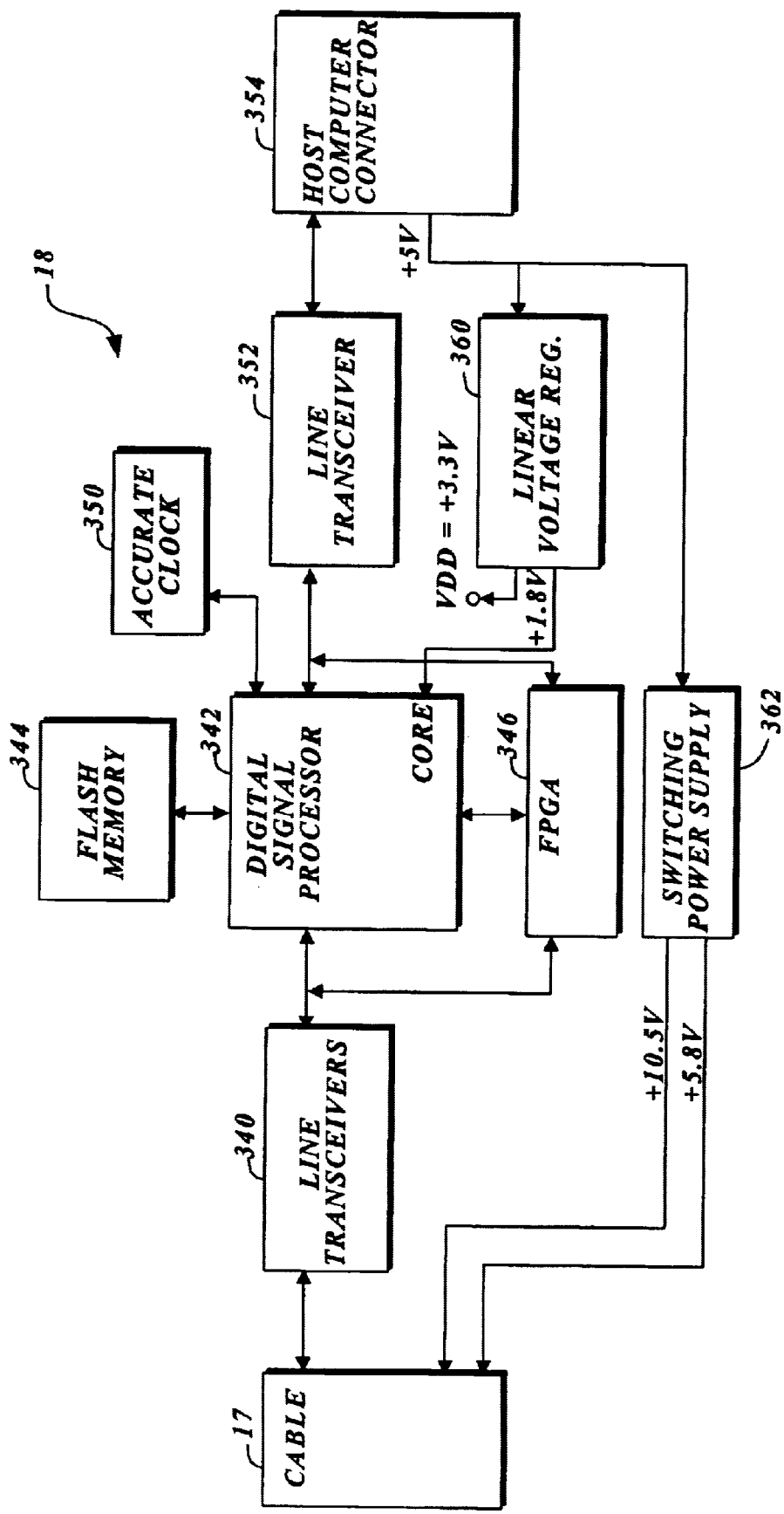
FIG. 12 is a block diagram of an interface electronics circuit.

FIG. 12 is a block diagram of an exemplary embodiment of interface electronics 18. The interface electronics 18 is coupled to the host computer system through a host computer connector 354, which carries a power supply for the encoder system and couples communication signals to and from a line transceiver 352. The line transceiver 352 provides communication signals at designated voltage logic levels. In one embodiment, the power supply is a 5 volt supply and the designated voltage logic levels are 3.3 volts.

A dual linear voltage regulator 360 provides a required voltage (in one embodiment 1.8 volts) for the core of a digital signal processor 342, as well as a supply voltage (in one embodiment 3.3 volts) for powering all of the logic devices in the interface electronics, including the line transceivers 340 and 352. A switching power supply 362, which receives a supply voltage from the host computer connector 354, provides two voltage levels to the cable 17 or alternative connections as previously described. In one embodiment, the two voltage levels provided by the switching power supply 362 are 10.5 volts and 5.8 volts, which are applied to the cable 17. The cable 17 carries power to, and signals to and from the readhead 14 (see FIG. 11). The line transceivers 340 convert the signals over the cable 17 to and from the readhead interface chip 324 (see FIG. 11) to designated voltage logic levels. In one embodiment, the designated voltage logic levels are 3.3 volts. It should be appreciated that in various alternative embodiments where the interface electronics is located in or near to the readhead 14, the cable 17 and the transceivers 340 and/or the interface chip 324 (see FIG. 11) may be omitted.

The digital signal processor 342 receives commands from the host computer 30 (see FIG. 1) via the host computer connector 354 and the line transceiver 352. The digital signal processor 342 also triggers data acquisition in the readhead 14 via the line transceivers 340 and the cable 17. The digital signal processor 342 also receives digitized data from the readhead 14, computes the ABS position, and sends data to the host computer 30.

A flash memory 344 stores the digital signal processor 342 program code and transducer calibration data. In an alternate embodiment, the flash memory 344 may also store fuse maps for a field programmable gate array 346. The field programmable gate array 346 (which is not included in some embodiments) converts serial data from the readhead to an appropriate format for the digital signal processor 342. The field programmable gate array 346 may provide partial functionality of a universal asynchronous receiver-transmitter for host communications, and it may also be used to implement a dynamically programmable host interface protocol.

The digital signal processor 342 is also coupled to an accurate clock 350 of the interface electronics 18. The accurate clock 350 is used by the digital signal processor 342 and/or other elements of the readhead to produce accurate time measurement values corresponding to the timing signals generated by the readhead and received by the interface electronics 18 in order to determine the delay time calibration, as previously described. It will be appreciated that the exemplary systems and methods disclosed with reference to FIGS. 1–12 are advantageous in that they provide for the calibration of the sample delay time in an encoder unit. The calibration allows the sample delay time to be made more predictable and establishes a sample delay time that is to a high degree the same for a plurality of interchangeable encoders even when an accurate clock is prohibited in the encoder readhead, due to size or economic constraints. Furthermore, field calibration may be performed to eliminate timing drift due to time and/or temperature effects on the readhead components.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for operating a readhead of a position encoder system to determine a delay time calibration usable to provide a desired position sample delay time for the position encoder system, comprising:

receiving at least one signal with the readhead which starts a position signal sampling sequence in the readhead;

performing the position signal sampling sequence in the readhead; and sending timing signals generated during the position sampling sequence from the readhead to an interface electronics of the position encoder system which determines time values based on measurement of the sent timing signals and determines the delay time calibration based on the time values.

2. The method of claim 1, wherein the readhead comprises an inductive position transducer element.

3. The method of claim 2, wherein the readhead is operable in at least two modes comprising a normal position determining mode and a calibration mode; and the receiving at least one signal comprises receiving a calibration mode signal; and the performing the position signal sampling sequence comprises performing the position signal sampling sequence in the calibration mode of operation.

4. The method of claim 3, wherein the sending the timing signals comprises sending the timing signals on a signal line which carries signals other than timing signals during the normal position determining mode of operation.

5. The method of claim 2, wherein the position signal sampling sequence comprises demodulating and integrating at least one position signal derived from the inductive position transducer element.

6. The method of claim 5, wherein the position signal sampling sequence comprises a symmetric sampling sequence.

7. The method of claim 1, further comprising repeating at least the performing and sending steps a plurality of times such that the interface electronics of the position encoder system can determine average time values based on measurement of the sent timing signals and determine the delay time calibration based on the average time values.

8. The method of claim 1, wherein the position sampling sequence in the readhead uses a first periodic signal generated in the readhead and the sent timing signals are measured using a second periodic signal generated in the interface electronics.

9. The method of claim 8, wherein the second periodic signal comprises a clock signal having a nominal period at least 5 times shorter than the nominal period of the first periodic signal.

10. The method of claim 8, wherein the desired position sample delay time comprises a position sample delay within a specified plus or minus uncertainty relative to a desired nominal position sample delay time.

11. The method of claim 10, wherein the uncertainty is less than at least one of 250 nanoseconds, 100 nanoseconds, and the nominal period of the first periodic signal generated in the readhead.

12. An encoder readhead apparatus for a position encoder system which determines a delay time calibration usable to provide a desired position sample delay time for the position encoder system, the encoder readhead apparatus comprising a position transducer element and a transducer electronics, the transducer electronics comprising:

at least one signal input line and at least one signal output line connectable to an encoder interface circuit of the position encoder system;

a logic circuit connected to receive signal information input on the at least one signal input line, and to provide signal information sent on the at least one signal output line;

a signal processing circuit connected to input at least one digital signal from and output at least one digital signal to the logic circuit and further connected to input at least one position signal from the position transducer element; and at least one local oscillator circuit providing a periodic signal connected to at least one of the signal processing circuit and the logic circuit;

wherein:

the logic circuit is operable to start a position signal sampling sequence in the readhead in response to signal information input on the at least one signal input line;

the signal processing circuit portion is operable to sample the at least one position signal during the position signal sampling sequence;

at least one of the signal processing circuit and the logic circuit is further operable to generate timing signals during the position signal sampling sequence; and the logic circuit is further operable to send the timing signals on the at least one signal output line to the interface electronics of the position encoder system at least when the interface electronics is configured to determine time values based on measurement of the sent timing signals and determine the delay time calibration based on the time values.

13. The encoder readhead apparatus of claim 12, wherein the position transducer element comprises an inductive position transducer element.

14. The encoder readhead apparatus of claim 13, wherein the transducer electronics is operable in at least two modes comprising a normal position determining mode and a calibration mode, and during the calibration mode:

the logic circuit starts the calibration mode, including a position signal sampling sequence, in response to a calibration request signal input on the at least one signal input line;

the at least one of the signal processing circuit and the logic circuit generates the timing signals during the position signal sampling sequence included in the calibration mode; and the logic circuit sends the timing signals on the at least one signal output line to the interface electronics which are configured during the calibration mode to determine the time values based on measurement of the sent timing signals and determine the delay time calibration based on the time values.

15. The encoder readhead apparatus of claim 14, wherein the logic circuit sends the timing signals on a signal line which carries signals other than timing signals during the normal position determining mode of operation.

16. The encoder readhead apparatus of claim 13, wherein sampling the at least one position signal during the position signal sampling sequence comprises demodulating and integrating the at least one position signal.

17. The encoder readhead apparatus of claim 16, wherein the position signal sampling sequence comprises a symmetric sampling sequence.

18. The encoder readhead apparatus of claim 12, wherein the position signal sampling sequence in the readhead uses the periodic signal provided by the at least one local oscillator circuit and the sent timing signals are measured using a second periodic signal generated in the interface electronics.

19. The encoder readhead apparatus of claim 18, wherein the second periodic signal comprises a clock signal having a nominal period at least 5 times shorter than the nominal period of the periodic signal provided by the at least one local oscillator circuit.

20. The encoder readhead apparatus of claim 18, wherein the desired position sample delay time comprises a position sample delay within a specified plus or minus uncertainty relative to a desired nominal position sample delay time.

21. The encoder readhead apparatus of claim 20, wherein the uncertainty is less than at least one of 250 nanoseconds, 100 nanoseconds, and the nominal period of the first periodic signal generated in the readhead.

22. A method for operating a position encoder system to determine a delay time calibration usable to provide a desired position sample delay time for the position encoder system, the position encoder system comprising an interface circuit, a scale and a readhead, the method comprising:

sending at least one calibration signal from the interface circuit to the readhead;

starting a position signal sampling sequence in a calibration mode of the readhead in response to receiving the at least one calibration signal;

performing the position signal sampling sequence in the readhead;

sending timing signals generated during the position sampling sequence from the readhead to the interface circuit; and determining the delay time calibration based the sent timing signals and a clock signal generated in the interface circuit.

23. The method of claim 22, wherein the readhead comprises an inductive position transducer element.

24. The method of claim 22, further comprising saving the delay time calibration to a memory; and utilizing the delay time calibration to provide the desired position sample delay time for the position encoder system.

25. The method of claim 24, wherein the position encoder system is operable in at least two modes comprising a normal position determining mode and a calibration mode and the utilizing the delay time calibration to provide the desired position sample delay time for the position encoder system comprises:

receiving at least one position request signal from a host processor using the interface circuit;

sending at least one calibrated position request signal in the normal position determining mode from the interface circuit to the readhead, the at least one calibrated position request signal delayed according to the delay time calibration relative to the position request signal from the host processor; and starting the position signal sampling sequence in a normal position determining mode in the readhead in response to receiving the at least one calibrated position request signal.

26. The method of claim 22, wherein the position sampling sequence in the readhead uses a periodic signal generated in the readhead.

27. The method of claim 26, wherein the clock signal generated in the interface circuit comprises a clock signal having a nominal period at least 5 times shorter than the nominal period of the periodic signal generated in the readhead.

28. A position encoder system which determines a delay time calibration usable to provide a desired position sample delay time for the position encoder system, the position encoder system comprising a scale, a readhead and an encoder interface circuit connectable to a host processor, the readhead comprising a position transducer element and a transducer electronics, the transducer electronics comprising:

at least one signal input line and at least one signal output line connectable to the encoder interface circuit;

a logic circuit connected to receive signal information input on the at least one signal input line, and to provide signal information sent on the at least one signal output line;

a signal processing circuit connected to input at least one digital signal from and output at least one digital signal to the logic circuit and further connected to input at least one position signal from the position transducer element; and at least one local oscillator circuit providing a periodic signal connected to at least one of the signal processing circuit and the logic circuit;

wherein:

the interface circuit is operable to send at least one calibration signal to the readhead on the at least one signal input line;

the logic circuit is operable to start a position signal sampling sequence in a calibration mode of the readhead in response to the at least one calibration signal;

the signal processing circuit portion is operable to sample the at least one position signal during the position signal sampling sequence;

at least one of the signal processing circuit and the logic circuit is further operable to generate timing signals during the position signal sampling sequence;

the logic circuit is further operable to send the timing signals on the at least one signal output line to the interface electronics of the position encoder system; and the interface circuit is operable to determine the delay time calibration based on the sent timing signals and a clock signal generated in the interface circuit.

29. The position encoder system of claim 28, wherein the position transducer element comprises an inductive position transducer element.

30. The position encoder system of claim 28, wherein the encoder interface circuit comprises a memory and is further operable to:

save the delay time calibration to a memory; and utilize the delay time calibration to provide the desired position sample delay time for the position encoder system.

31. The position encoder system of claim 30, wherein the position encoder system is operable in at least two modes comprising a normal position determining mode and a calibration mode and during the normal position determining mode the position encoder system is operable to provide the desired position sample delay time for the position encoder system by:

receiving at least one position request signal from the host processor using the encoder interface circuit;

sending at least one calibrated position request signal in the normal position determining mode from the interface circuit to the readhead, the at least one calibrated position request signal delayed according to the delay time calibration relative to the position request signal from the host processor; and starting the position signal sampling sequence in a normal position determining mode in the readhead in response to receiving the at least one calibrated position request signal.

32. The position encoder system of claim 28, wherein the position sampling sequence in the readhead uses a periodic signal generated in the readhead.

33. The position encoder system of claim 32, wherein the clock signal generated in the interface circuit comprises a clock signal having a nominal period at least 5 times shorter than the nominal period of the periodic signal generated in the readhead.

34. The encoder readhead apparatus of claim 32, wherein the desired position sample delay time comprises a position sample delay within a specified plus or minus uncertainty relative to a desired nominal position sample delay time.

35. The encoder readhead apparatus of claim 34, wherein the uncertainty is less than at least one of 250 nanoseconds, 100 nanoseconds, and the nominal period of the periodic signal generated in the readhead.

\* \* \* \* \*

UNITED STATES PATENT AND TRADEMARK OFFICE
CERTIFICATE OF CORRECTION

PATENT NO. : 6,639,529 B1
DATED : October 28, 2003
INVENTOR(S) : B.E.B. Jansson

It is certified that error appears in the above-identified patent and that said Letters Patent is hereby corrected as shown below:

Title page,
Item [56], References Cited, U. S. PATENTS DOCUMENTS, insert in appropriate order:

| | | |
|---|---|---|
| --4,008,455 | 2/1977 | Pedersen |
| 4,761,608 | 8/1988 | Franklin et al. |
| 4,991,125 | 2/1991 | Ichikawa |
| 5,007,177 | 4/1991 | Rieder et al. |
| 5,053,713 | 10/1991 | Henoch |
| 5,260,769 | 11/1993 | Ieki et al. |
| 5,333,390 | 8/1994 | Petterson et al. |
| 5,386,642 | 2/1995 | Spies et al. |
| 5,408,758 | 4/1995 | Mizutani et al. |
| 5,488,782 | 2/1996 | Ochiai |
| 5,535,142 | 7/1996 | Mehnert et al. |
| 5,689,203 | 11/1997 | Geist |
| 5,721,546 | 2/1998 | Tsutsumishita |
| 5,742,921 | 4/1998 | Oo et al. |
| 5,798,640 | 8/1998 | Gier et al. |
| 5,861,754 | 1/1999 | Ueno et al. |
| 5,901,458 | 5/1999 | Andermo et al. |
| 5,924,214 | 7/1999 | Boege et al. |
| 5,935,070 | 8/1999 | Dolazza et al. |
| 5,956,659 | 9/1999 | Spies et al. |
| 6,005,387 | 12/1999 | Andermo et al. |
| 6,011,389 | 1/2000 | Masreliez et al. |
| 6,029,363 | 2/2000 | Masreliez et al. |
| 6,049,204 | 4/2000 | Andermo et al. |
| 6,304,832 B1 | 10/2001 | Andermo et al.-- |

Signed and Sealed this

Twenty-eighth Day of December, 2004

JON W. DUDAS
*Director of the United States Patent and Trademark Office*